United States Patent
Zhang et al.

(10) Patent No.: US 8,809,150 B2
(45) Date of Patent: Aug. 19, 2014

(54) MOS WITH RECESSED LIGHTLY-DOPED DRAIN

(75) Inventors: Guowei Zhang, Singapore (SG); Purakh Raj Verma, Singapore (SG); Zhiqing Li, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/587,059

(22) Filed: Aug. 16, 2012

(65) Prior Publication Data

US 2014/0048874 A1  Feb. 20, 2014

(51) Int. Cl.
*H01L 21/336* (2006.01)

(52) U.S. Cl.
USPC ........... 438/285; 438/590; 257/336; 257/369; 257/192

(58) Field of Classification Search
USPC .......... 257/336, 369, 192, E21.063, E29.162; 438/285, 590
See application file for complete search history.

(56) References Cited

U.S. PATENT DOCUMENTS

| | | | | |
|---|---|---|---|---|
| 5,828,103 A | * | 10/1998 | Hsu | 257/344 |
| 2005/0148148 A1 | * | 7/2005 | Cheng | 438/299 |
| 2005/0218460 A1 | * | 10/2005 | Hasegawa et al. | 257/390 |

* cited by examiner

*Primary Examiner* — Theresa T Doan
(74) *Attorney, Agent, or Firm* — Ditthavong & Steiner, P.C.

(57) ABSTRACT

LDD regions are provided with high implant energy in devices with reduced thickness poly-silicon layers and source/drain junctions. Embodiments include forming an oxide layer on a substrate surface, forming a poly-silicon layer over the oxide layer, forming first and second trenches through the oxide and poly-silicon layers and below the substrate surface, defining a gate region therebetween, implanting a dopant in a LDD region through the first and second trenches, forming spacers on opposite side surfaces of the gate region and extending into the first and second trenches, and implanting a dopant in a source/drain region below each of the first and second trenches.

15 Claims, 9 Drawing Sheets

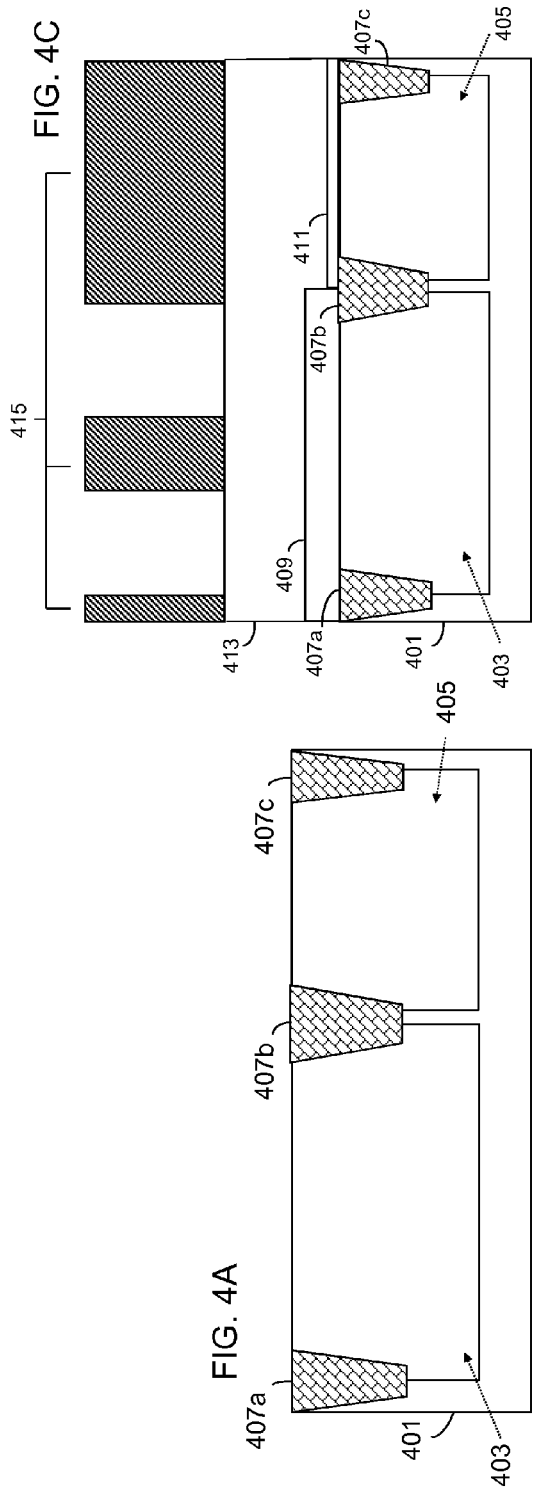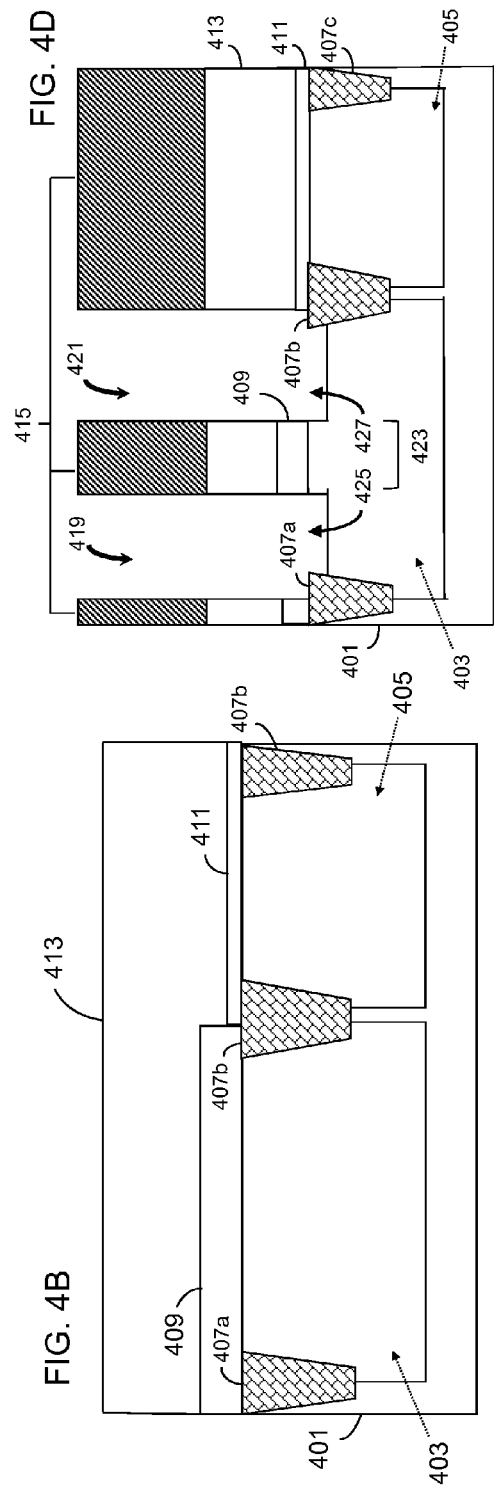

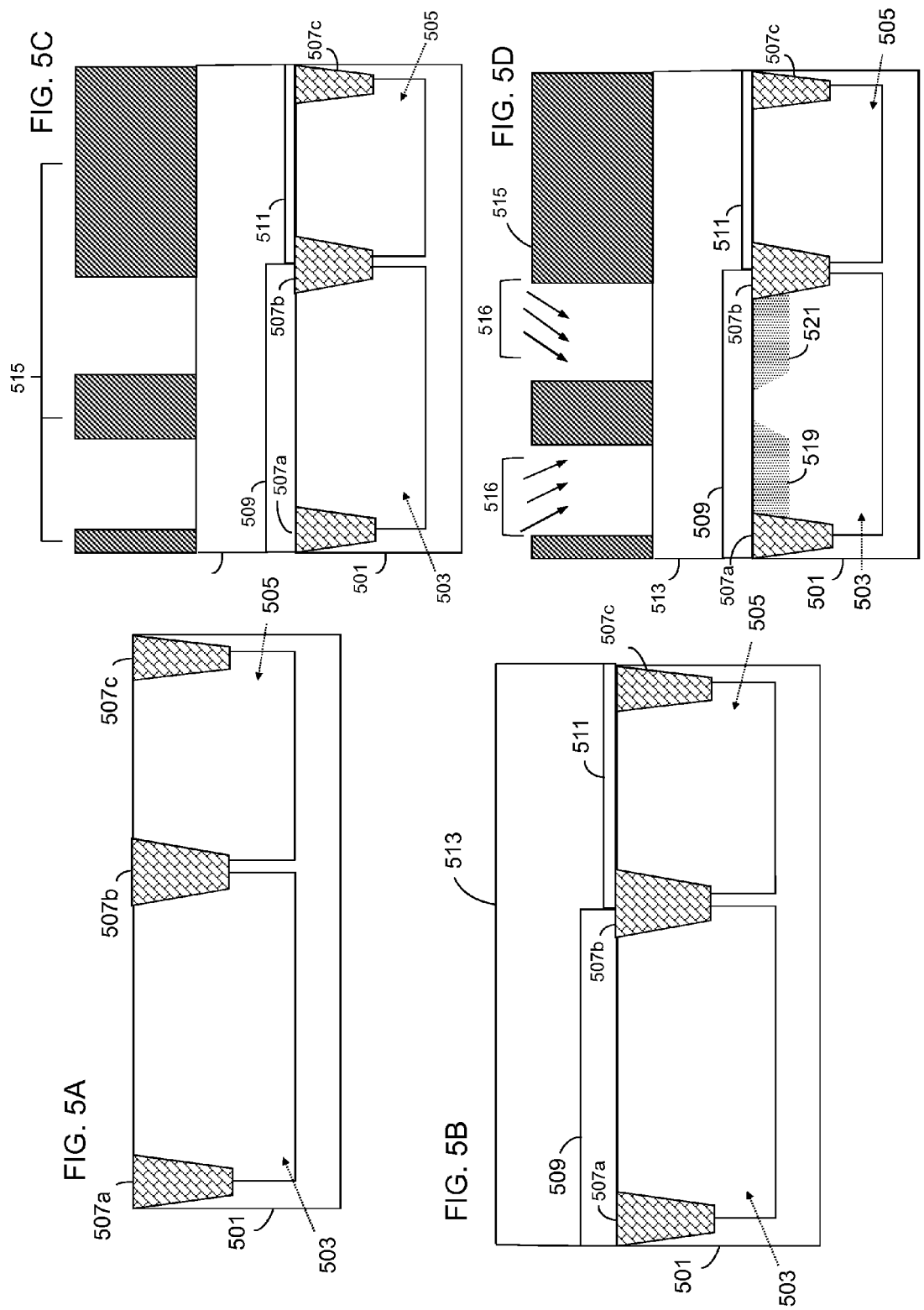

MOS WITH RECESSED LIGHTLY-DOPED DRAIN

TECHNICAL FIELD

The present disclosure relates to integration of input/output metal oxide semiconductor (MOS) devices (e.g., with voltages of 2.5 V to 5 V) with nano technology core devices. The present disclosure is particularly applicable to devices employing lightly doped drain (LDD) regions.

BACKGROUND

Generally, for system-on-chip (SOC) applications, it is becoming very important to have a cost-effective process which provides for integration of low voltage complementary MOS (CMOS) for logic and intermediate (or medium) voltage devices for analog devices and for I/O interface stages. The I/O stages typically require high-speed switches and high-package density, which further require low on-resistance (e.g., low $Rds_{on}$), high breakdown voltage (e.g., higher BVdss), and low Miller capacitance.

In addition, as higher-voltage devices integrate with core devices (which are lower-voltage devices) on the nanoscale, physical limits are being approached. For example, highly-doped source/drain implants, needed for the higher potentials on the higher-voltage devices, are being moved closer to the conducting channel, resulting in high leakage and substrate currents. Longer channel lengths must, therefore, be employed, which in turn degrade device performance. Similarly, the reduction in the thickness of poly-silicon layers and source/drain junctions to improve core device performance reduces electrostatic discharge (ESD) protection and leads to poly-silicon penetration during high energy LDD implants. However, limiting LDD implant energy conflicts with the high-voltage device requirement of deeper source/drain junctions to sustain higher I/O voltages.

FIG. 1 illustrates a common self-aligned metal oxide semiconductor (MOS) structure having a substrate 101 with shallow trench isolation (STI) regions 103a and 103b, lightly-doped (LDD) source/drain regions 105 and 106, more strongly-doped source/drain regions 107 and 108, and well region 109. A gate stack 111, positioned on the substrate 101, includes gate oxide layer 113, poly-silicon layer 115, and metal silicide layer 117. Spacers 119 and 121 separate the gate stack 111 from silicide 123 and 125 positioned over source/drain regions 107 and 108, respectively. The LDD regions 105 and 106 extend slightly underneath the gate oxide layer 113 at opposite sides of conductive channel 127 beneath gate 111. Although the structure is able to operate at intermediate voltages (e.g., voltages between 2.5 V and 5 V), a long channel length (e.g., 0.4 µm to 0.9 µm) is typically required to pass hot carrier injection, and the structure is unable to achieve sufficiently low on resistance even when the breakdown voltage is low. Moreover, since the width of spacers 119 and 121 is typically minimized to increase device density, highly-doped portions of the source and drain 105 and 107 are moved closer to the channel, resulting in higher substrate currents, which in turn may cause deleterious hot-carrier effects.

FIG. 2 illustrates an extended drain metal oxide semiconductor (EDMOS), another approach that has been proposed to overcome the difficulties with moving the highly-doped source/drain closer to the channel as package density is increased (i.e., the limitations of the structure in FIG. 1). Similar to FIG. 1, the structure in FIG. 2 includes a substrate 201 having a well region 203, LDD region 205 and highly-doped source region 207, a gate stack 209 including gate oxide 211, poly-silicon layer 213, and silicide 215, spacers 217a and 217b, silicide 219a and 219b, and STI regions 221a and 221b. The structure of FIG. 2 differs from that of FIG. 1 in that the LDD region 225 associated with drain region 229 is extended in the lateral direction both toward channel 227 and toward drain region 229, and highly doped drain region 229 is moved laterally away from channel 227. To accommodate the extended LDD region 225, a silicide block 231 is positioned between spacer 217b and silicide 219b. While this structure moves the highly-doped drain region 229 away from the channel 227, it suffers from certain disadvantages associated with the additional length added to the drain region. For example, since $Rds_{on}$ increases with device pitch (the length between successive gates on a device), and the additional length of the drain region effectively increases the pitch, $Rds_{on}$ tends to be high, making the structure less applicable for symmetrical use. Additionally, fabrication difficulties increase because the highly-doped drain region 229 is no longer self-aligned and the implant energy used to dope the LDD region 225 is limited by the thickness of the gate poly-silicon layer 213.

A need therefore exists for methodology enabling use of short channel lengths and high LDD implantation energy, not limited by poly-silicon thickness, and the resulting structure.

SUMMARY

An aspect of the present disclosure is a method of forming an I/O device with recessed source/drain regions for forming LDD regions.

Another aspect of the present disclosure is an I/O device with recessed source/drain regions for forming LDD regions.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method comprising: forming an oxide layer on a substrate surface; forming a poly-silicon layer over the oxide layer; forming first and second trenches through the oxide and poly-silicon layers and below the substrate surface, defining a gate region therebetween; implanting a dopant in an LDD region through the first and second trenches; forming spacers on opposite side surfaces of the gate region and extending into the first and second trenches; and implanting a dopant in a source/drain region below each of the first and second trenches.

Aspects of the present disclosure include forming a silicide in the first and second trenches, subsequent to implanting the dopant in the source/drain regions. Further aspects include forming the first and second trenches by: forming a mask over the oxide and poly-silicon layers, the mask leaving exposed regions defining the first and second trenches, and etching the poly-silicon layer, the oxide layer, and the substrate; implanting the dopant in the LDD region; and removing the mask. Another aspect includes forming the first and second trenches to a depth of 10 nm to 200 nm below the substrate surface and to a width of 0.2 µm to 0.6 µm. Additional aspects include implanting the dopant in the LDD region at energies of 30 kiloelectron volts (keV) to 300 KeV. Other aspects include forming first and second well regions in the substrate, prior to forming the oxide layer; forming the oxide layer to a greater thickness over the first well region than over the second well region; and forming the first and second trenches in the first well region. Further aspects include patterning a second gate region in the poly-silicon and oxide layers over the second well region; forming a mask over the substrate, the mask leaving exposed the second gate region and the substrate surface around the second gate region; and implanting a dopant in the substrate around the second gate region, forming a second LDD region.

Another aspect of the present disclosure is a device including: a substrate having a surface; a gate region on the substrate surface; a recess in the substrate on each side of the gate region; a source/drain region in the substrate, below each recess; and a spacer on each side of the gate region and extending down into the recess.

Aspects include a device wherein the recess has a depth of 10 nm to 200 nm and a width of 0.2 µm to 0.6 µm in width. Further aspects include an LDD region in the substrate around a portion of the spacer that extends into each recess. Other aspects include: a second gate region on the substrate surface; second spacers on opposite sides of the second gate region; a second source/drain region in the substrate, on opposite sides of the second gate region; and a second LDD region below each second spacer. Additional aspects include an oxide layer in the gate region having a thickness of 50 Å to 150 Å; and a poly-silicon layer in the gate region having a thickness of 50 nm to 300 nm.

Another aspect of the present disclosure is a method including: forming an oxide layer on a substrate surface; forming a poly-silicon layer over the oxide layer; implanting a dopant in an LDD region in the substrate through the oxide and poly-silicon layers; forming first and second trenches in the oxide and poly-silicon layers and in a portion of substrate below the substrate surface, defining a gate region therebetween; forming spacers on opposite side surfaces of the gate region and extending into the first and second trenches; and implanting a dopant in a source/drain region below each of the first and second trenches.

Aspects include forming a silicide in the first and second trenches, subsequent to implanting the dopant in the source/drain regions. Other aspects include forming a mask over the oxide and poly-silicon layers, prior to implanting the LDD region, the mask leaving exposed regions defining the first and second trenches. Further aspects include forming the poly-silicon layer to a thickness of 0.05 µm to 0.3 µm. Additional aspects include implanting the dopant in the LDD regions at energies of 100 keV to 400 keV. Another aspect includes forming the first and second trenches to a depth of 10 nm to 200 nm below the substrate surface and a width of 0.2 µm to 0.6 µm. Further aspects include forming first and second well regions in the substrate, prior to forming the oxide layer; forming the oxide layer to a greater thickness over the first well region than over the second well region; and forming the first and second trenches in the first well region. Other aspects include patterning a second gate region in the poly-silicon and oxide layers over the second well region; forming a mask over the substrate, the mask leaving exposed the second gate region and the substrate surface around the second gate region; and implanting a dopant in the substrate around the second gate region, forming a second LDD region.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 4A through 4K schematically illustrates a process flow for providing the MOS of FIG. 3 with a recessed source/drain, in accordance with an embodiment of the present disclosure; and FIGS. 5A through 5K schematically illustrate a process flow for providing the MOS of FIG. 3 with a recessed source/drain, in accordance with another embodiment of the present disclosure.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of high $Rds_{on}$, high substrate current, and LDD non-alignment in intermediate voltage MOS structures attendant upon integrating I/O devices with nanoscale core devices. The present disclosure addresses and solves such problems, for instance, by inter alia, forming recesses in a substrate at opposite sides of a gate stack and implanting LDD regions through the recesses, and implanting highly-doped source/drain regions below recesses. This effectively moves the highly-doped regions of the source/drain downward, away from the conducting channel, which lowers substrate current and also provides a longer drift region supportive of the higher (e.g. 2.5 V to 5 V) voltages used for I/O devices, and uses a self-aligned LDD implant for which the implant energy is not limited by the gate poly-silicon thickness.

Figure 1:
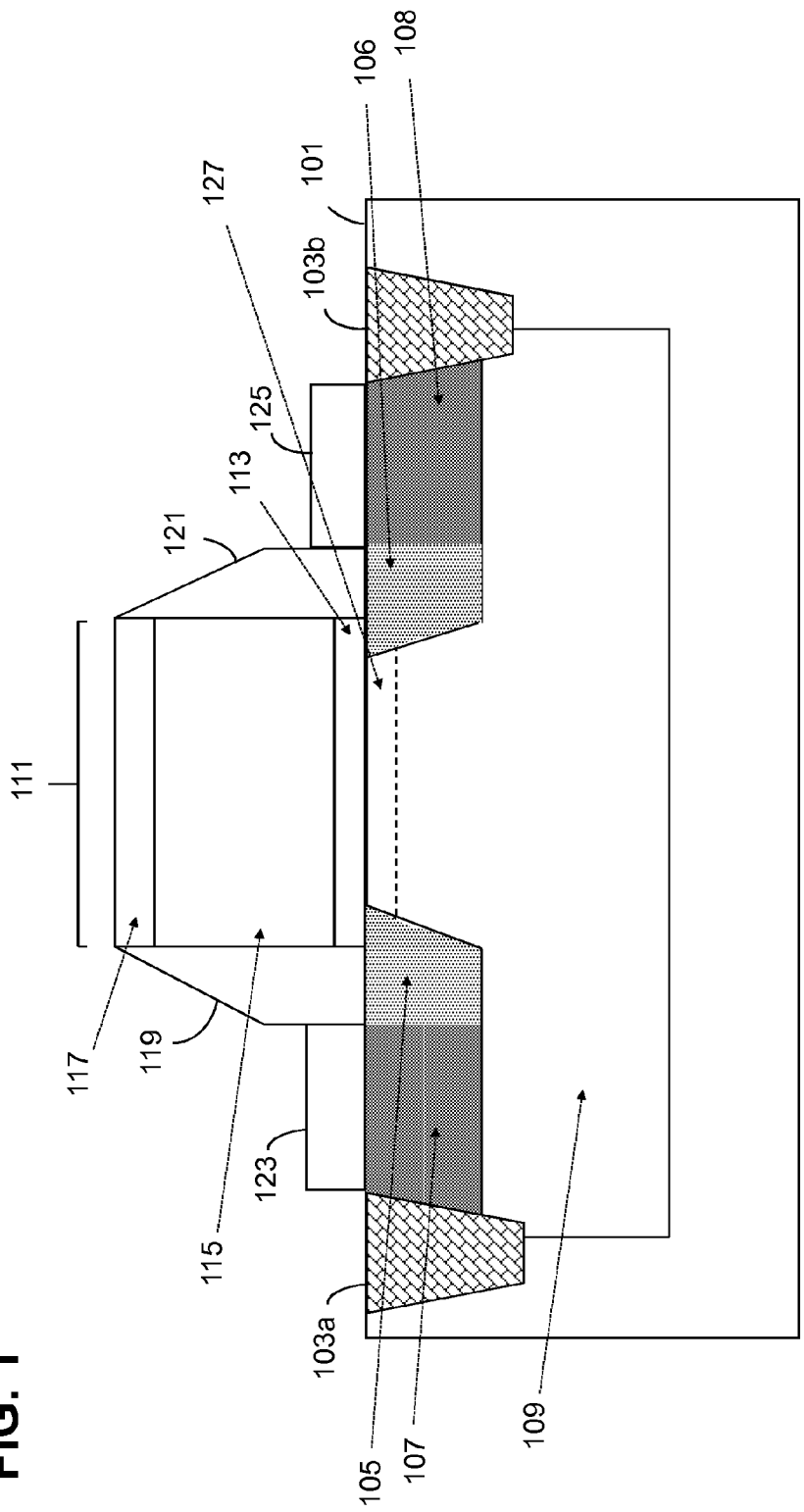
FIG. 1 schematically illustrates a background structure of a self-aligned MOS with LDD regions.
Figure 2:
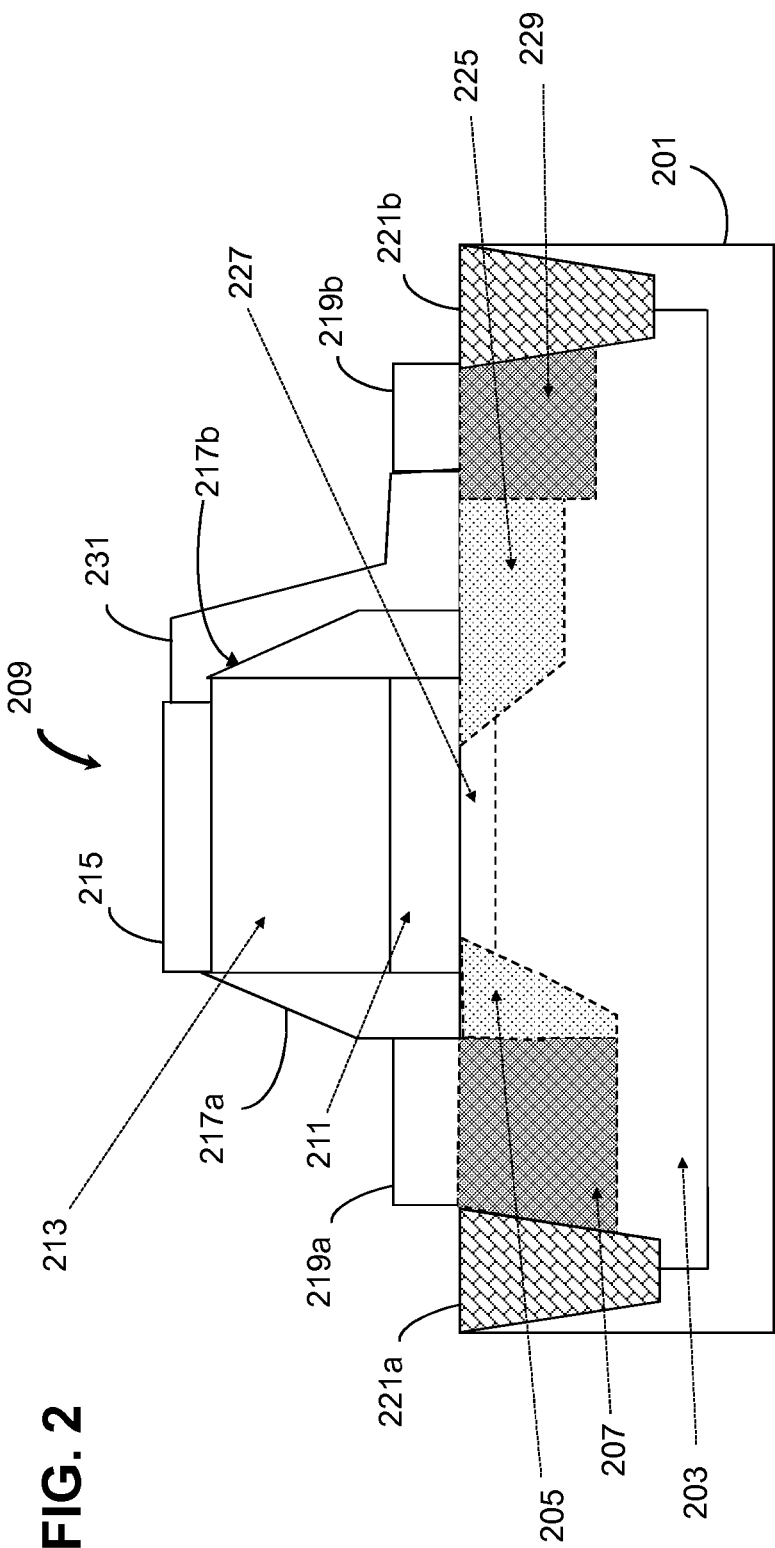
FIG. 2 schematically illustrates a background structure of an EDMOS.
Figure 3:
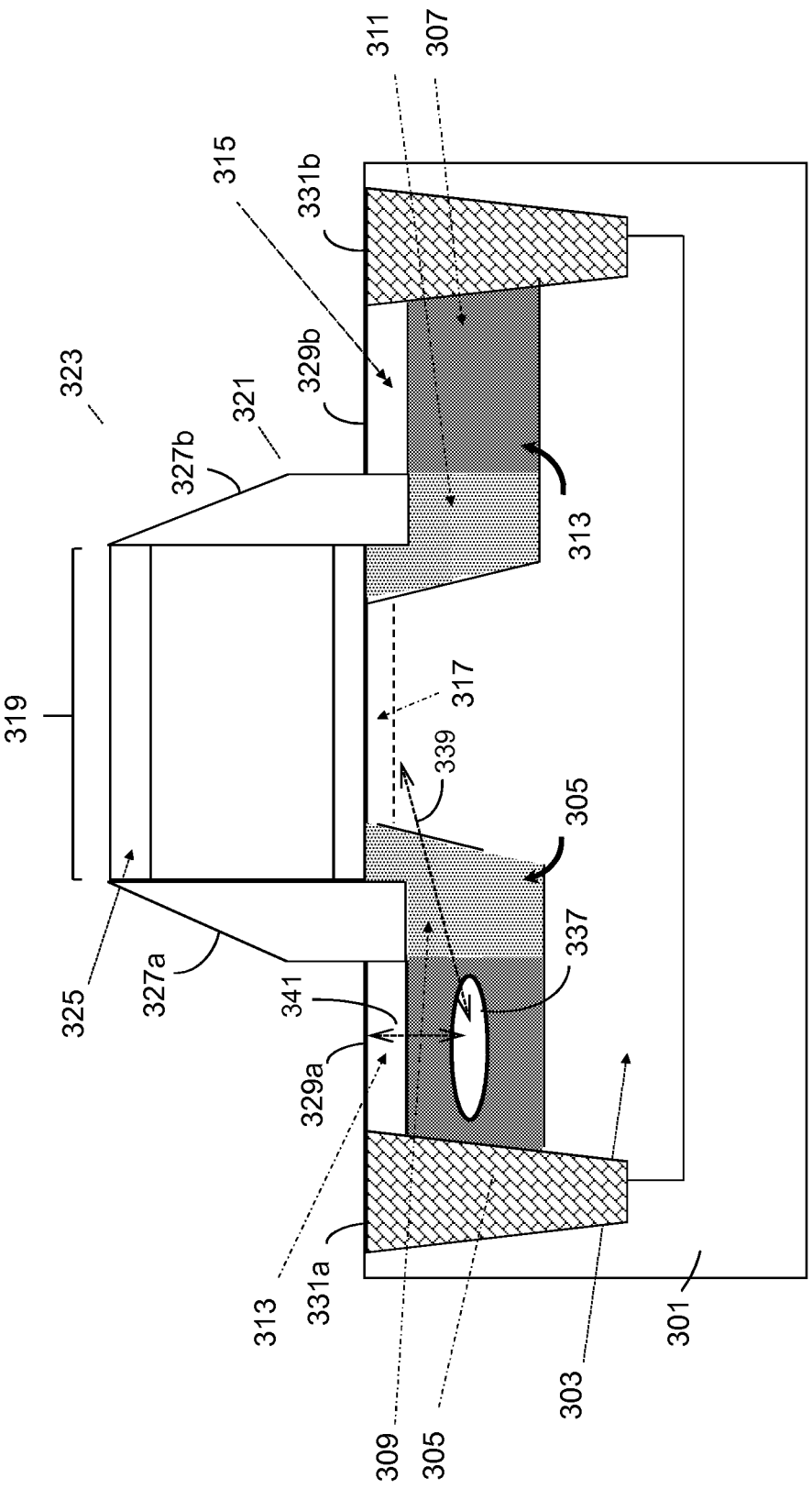
FIG. 3 schematically illustrates an MOS with a recessed source/drain, in accordance with an embodiment of the present disclosure.

FIG. 3 schematically illustrates an MOS with a recessed source/drain region, in accordance with an embodiment of the present disclosure. The MOS is shown as an NMOS for illustrative purposes, but the structure applies equally for a PMOS. The structure shown includes substrate 301, well region 303, highly doped (N+) source/drain regions 305 and 307 and, LDD regions 309 and 311 formed in recesses 313 and 315, respectively, and channel region 317 between the LDD regions 309 and 311. The structure further includes gate stack 319 on the substrate over the channel 317 and portions of LDD regions 309 and 311. The gate stack includes gate oxide layer 321, poly-silicon layer 323, and silicide 325. The structure further includes spacers 327a and 327b positioned at opposite sides of the gate stack, silicide 329a and 329b formed in recesses 313 and 315, and STI regions 331a and 331b. As shown by indicator 337, which depicts the 'center of density' of N+ dopants in source region 305, the distance between indicator 337 and channel 317, shown by arrow 339, is larger in comparison with the structure of FIG. 1 (this applies equally to the highly-doped drain/channel distance); this larger distance provides improved substrate current and breakdown voltage characteristics without increasing device pitch and thereby increases $Rds_{on}$, as in the structure of FIG. 2. Additionally, the distance between indicator 337 and the substrate surface, shown by arrow 341, is greater (i.e., the highly-doped region is deeper) than the structures shown in FIGS. 1 and 2, enabling the structure shown in FIG. 3 to support higher I/O voltages than the other structures.

In the structure of FIG. 3, the recesses 313 and 315 may, for example, have a depth of 0.01 μm to 0.2 μm, and a width of 0.2 μm to 0.6 μm. Due to formation of recesses 313 and 315, the distance between the highly-doped region 337 and the channel 317 may increase by approximately 0.01 to 0.2 μm. The well region 303 may have a depth of 0.5 μm to 2 μm, the gate oxide layer 321 may have a thickness of 5 to 15 nm, and the poly-silicon layer 327 may have a thickness of 0.05 μm to 0.3 μm.

Figure 4E:
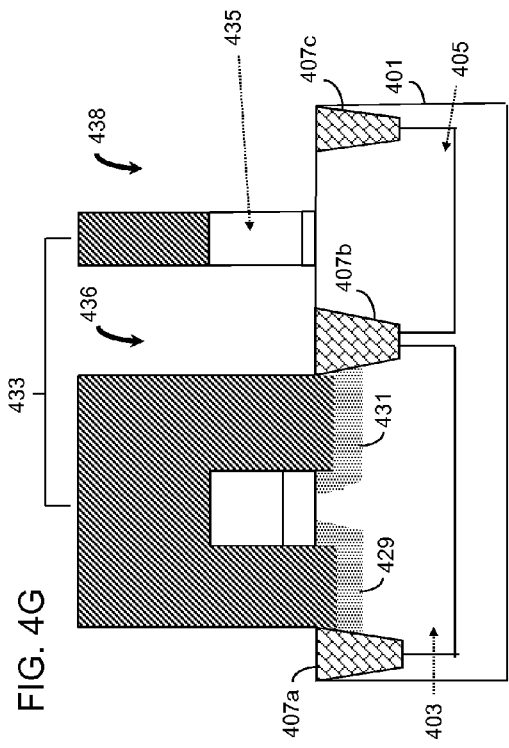

FIGS. 4A through 4K schematically illustrate a process flow for providing the structure of FIG. 3, in accordance with an embodiment of the present disclosure. Adverting to FIG. 4A, conventional processing may be performed to provide substrate 401, p-wells 403 and 405, for the I/O and core devices, respectively, and STI regions 407a, 407b, and 407c. FIG. 4B illustrates the formation of oxide layers 409 and 411, and poly-silicon layer 413 over the oxide layers. As shown, oxide layers 409 and 411 may be of different thicknesses to account for the different voltage requirements of the I/O device (greater thickness) and core device (smaller thickness). For example, the thickness of the oxide layer 409 may be 5 to 15 nm, whereas oxide layer 411 may have a thickness of 1 nm to 3 nm.

As illustrated in FIG. 4C, a patterned photoresist 415 is formed over poly-silicon layer 413. The resist 415 may be 0.5 μm to 2.0 μm in thickness, depending upon implant energies employed, as will be discussed further below. Adverting to FIG. 4D, trenches 419 and 421 are formed in exposed regions that are not covered by resist 415 (e.g., by a wet chemical etch), defining an I/O gate stack 423 therebetween. The etching process is controlled so as to etch through poly-silicon layer 413, oxide layer 409, and a portion of substrate 401, forming recesses 425 and 427, on opposite sides of gate stack 423, to a depth of 0.01 μm to 0.1 μm below the surface of the substrate 401 and a width of 0.2 μm to 0.6 μm.

FIG. 4E illustrates a self-aligned LDD implanting process in which dopants 424 are implanted through recesses 425 and 427 (e.g., by an angled implant), forming LDD regions 429 and 431. As illustrated, the LDD regions 429 and 431 are aligned with channel 428 as they are both formed using the resist 415 as a mask. Implant energies for the LDD formation may be 30 keV to 300 keV, and exposure times may be conventionally regulated to form LDD dopant concentration levels.

Figure 4G:
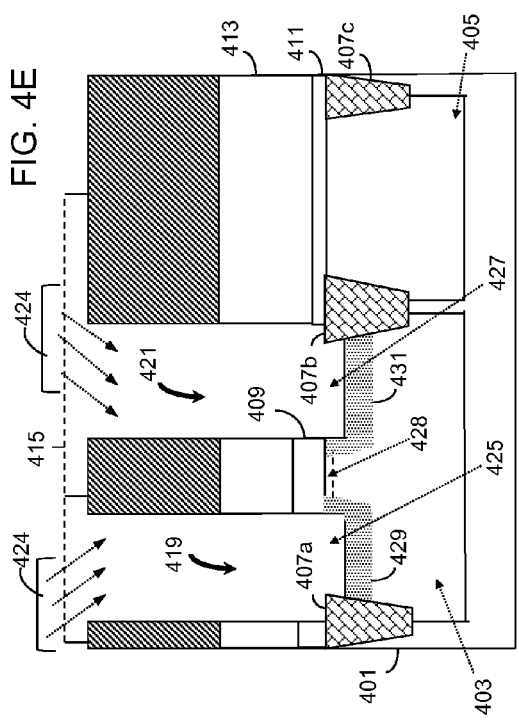
Figure 4F:
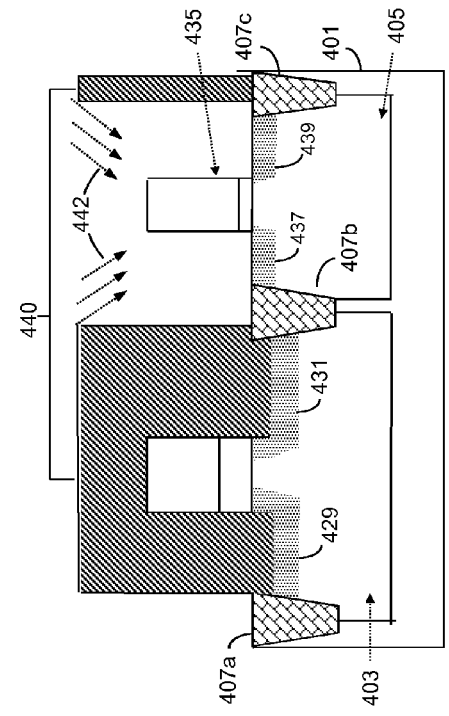
Figure 4H:
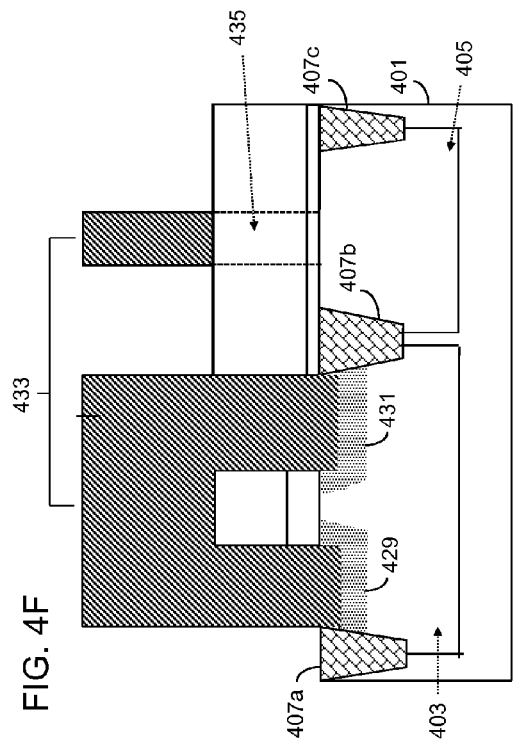

As shown in FIG. 4F, after implantation of the LDD regions 429 and 431, resist 415 is removed, and a resist 433 is deposited over the entire substrate. Resist 433 covers the gate region 423, fills trenches 419 and 421 and is patterned to define and cover a gate 435 of the core device. First and second trenches 436 and 438 are formed in the core area by, for example, etching of the exposed poly-silicon layer 413 and oxide layer 411 through resist 433 down to the surface of substrate 401 over p-well 405, as illustrated in FIG. 4G. Next, resist 433 is removed and replaced with patterned resist 440, covering gate stack 423 and LDD regions 429 and 431 and open over core p-well 405 and core gate 435. FIG. 4H illustrates a dopant 442 being implanted to form LDD regions 437 and 439 in p-well region 405 at opposite sides of core gate 435.

Figure 4K:
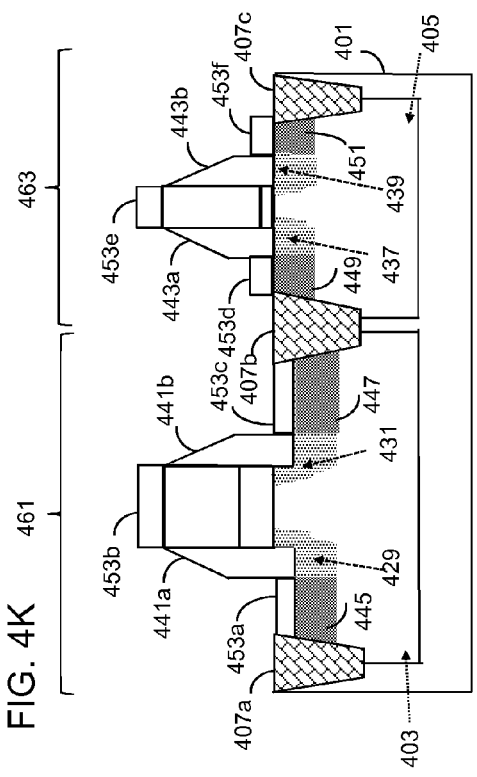
Figure 4I:
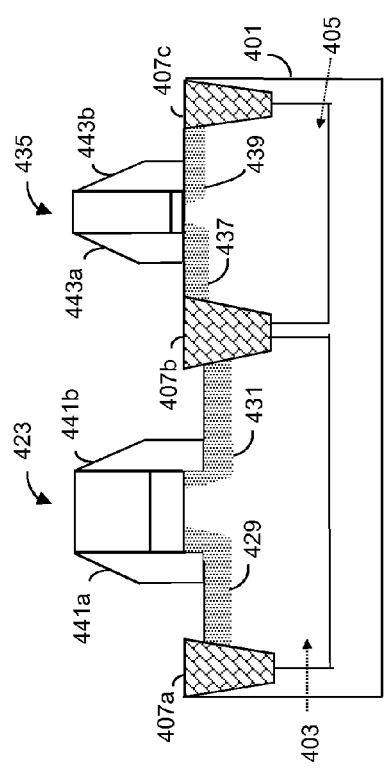
Figure 4J:
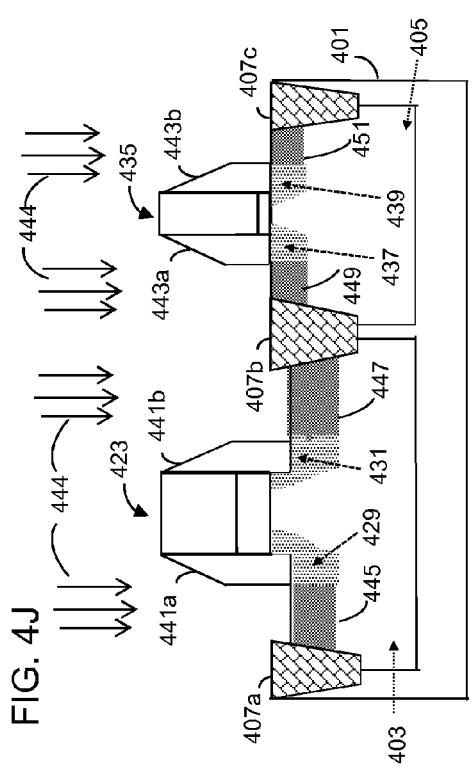

Adverting to FIG. 4I, after resist 440 is removed, spacers 441a and 441b (e.g., of silicon nitride) are formed around gate stack 423, and spacers 443a and 443b are formed around gate 435. The spacers define source/drain regions and protect the poly-silicon gates during the subsequent high-concentration dopant implantation, shown in FIG. 4J, for forming highly-doped (e.g., N+) source/drain regions 445 and 447 and 449 and 451. This high-concentration implant has a smaller angular spread than the LDD implant shown in FIG. 4E, but employs higher implant energies to drive dopants further into the substrate 401 (the implant energies used to create respective source/drain regions 445 and 447 and 449 and 451 in the respective well regions 403 and 405 may be different in accordance with device voltage requirements, but most of time, the source/drain implants are through same implantation step). In FIG. 4K further processing steps such as formation of metal silicide 453a through 453f and back end of line (BEOL) processes (not shown for illustrative convenience) are performed to complete the integrated circuit device according to an embodiment of the present disclosure, including I/O device 461 and core device 463.

Figure 5E:
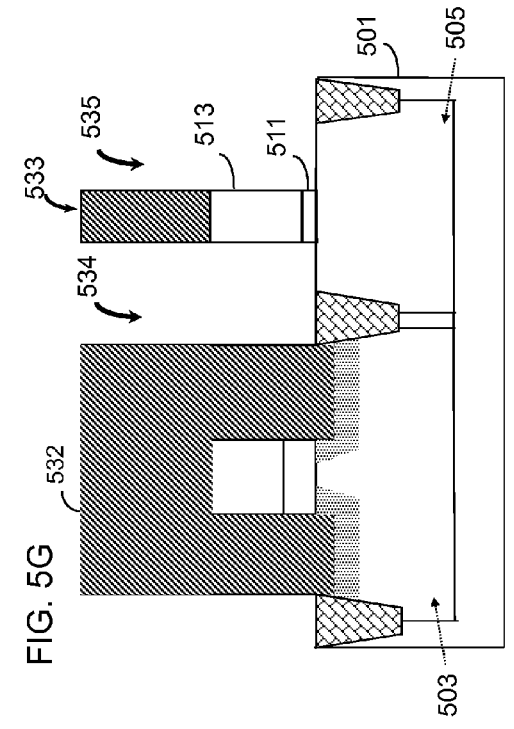

FIGS. 5A through 5K schematically illustrate a process flow for providing a MOS structure of FIG. 3, in accordance with another embodiment of the present disclosure. The process of FIGS. 5A through 5K begins similar to the embodiment of FIGS. 4A through 4K. Adverting to FIG. 5A, conventional processing may be performed to provide substrate 501, wells 503 and 505, for the I/O and core devices, respectively, and STI regions 507a, 507b, and 507c. FIG. 5B illustrates the formation of oxide layers 509 and 511, and poly-silicon layer 513 over the oxide layers 509 and 511. As shown, oxide layers 509 and 511 may be of different thicknesses to account for the different voltage requirements of the I/O device (greater thickness) and core device (smaller thickness). For example, the thickness of the oxide layer 509 may be 5 to 15 nm, and oxide layer 511 may have a thickness of 1 nm to 3 nm.

As illustrated in FIG. 5C, patterned photoresist 515 is formed over poly-silicon layer 513. The resist 515 may have a thickness of 0.5 μm to 2.0 μm, depending upon implant energies employed. Adverting to FIG. 5D, a self-aligned LDD implantation is performed prior to etching the I/O gate, rather than after etching as shown in FIG. 4E above. In FIG. 5D, dopants 516 are implanted through the poly-silicon layer 511 and oxide layer 509, using correspondingly higher implant energies to penetrate the layers, for example, of 130 keV to 300 keV, forming LDD regions 519 and 521. Then, first and second trenches 523 and 525 are formed (e.g., by wet etching) through poly-silicon layer 511, oxide layer 509, and part of substrate 501, as illustrated in FIG. 5E, to form gate stack 531. As shown, recesses 527 and 529 are formed on opposite sides of gate stack 531 similar to recesses 425 and 427.

Figure 5F:
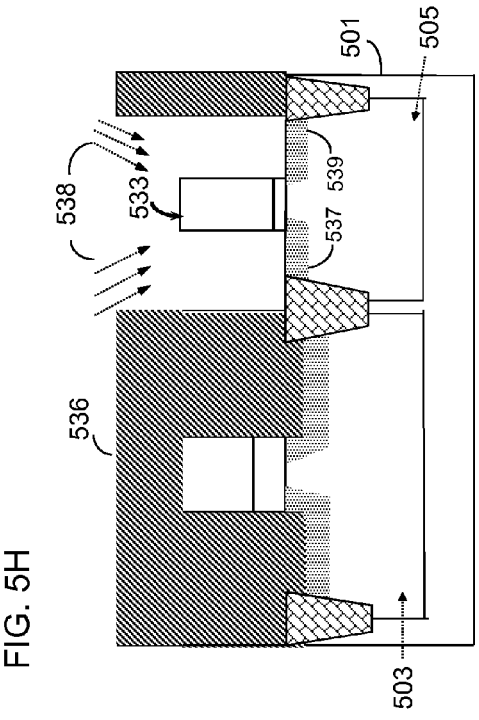
Figure 5G:
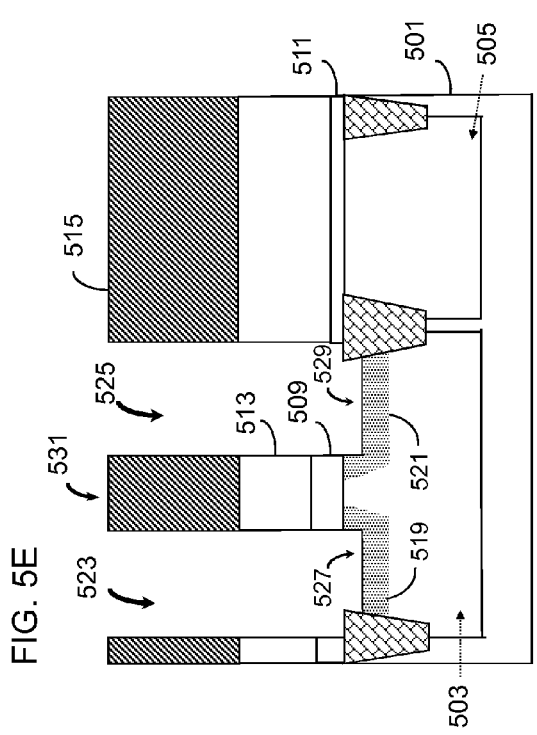
Figure 5H:
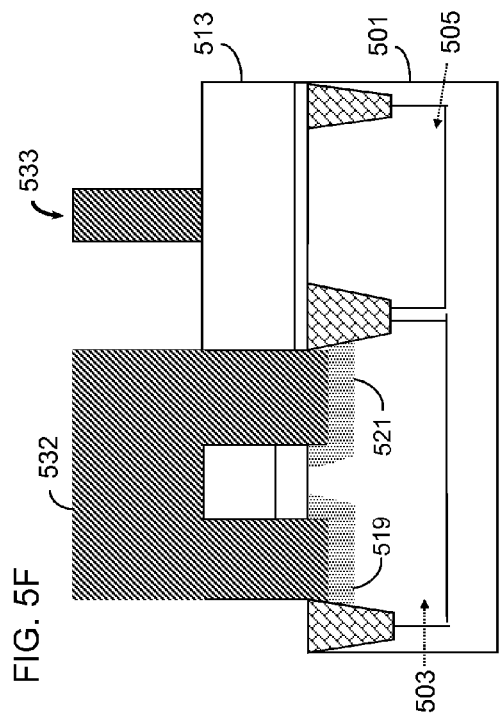

As shown in FIG. 5F, after formation of trenches 523 and 525, resist 515 is removed, and a resist 532 is deposited over the gate region 531 and filling trenches 523 and 525. The resist 532 is further patterned over poly-silicon layer 513 to define a gate 533 of the core device. Poly-silicon layer 513 and oxide layer 511 are etched through patterned resist 532, forming trenches 534 and 535 down to the surface of substrate 501, as illustrated in FIG. 5G. Next, as shown in FIG. 5H, resist 532 is removed and replaced with patterned resist 536, exposing core p-well 505 and core gate 533. A dopant 538 is then implanted through resist 536 to form LDD regions 537 and 539 in well region 505 at opposite sides of core gate 533.

Figure 5K:
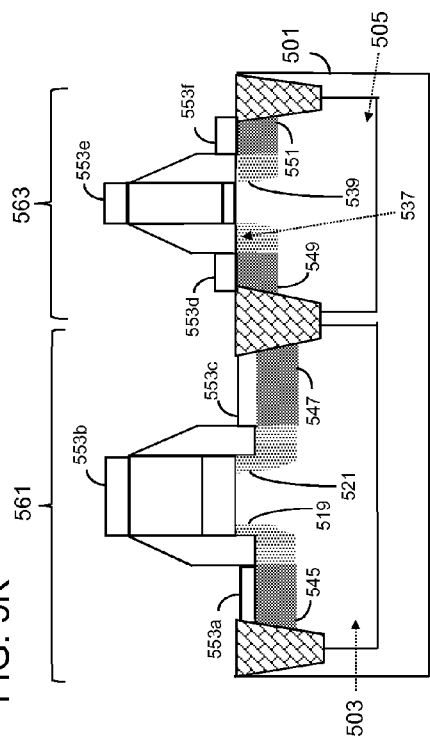
Figure 5I:
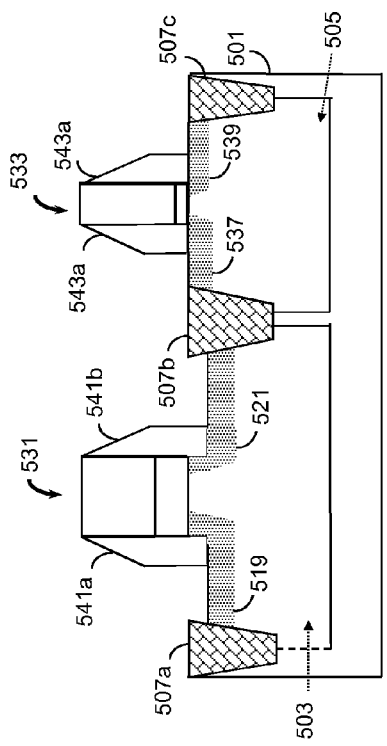
Figure 5J:
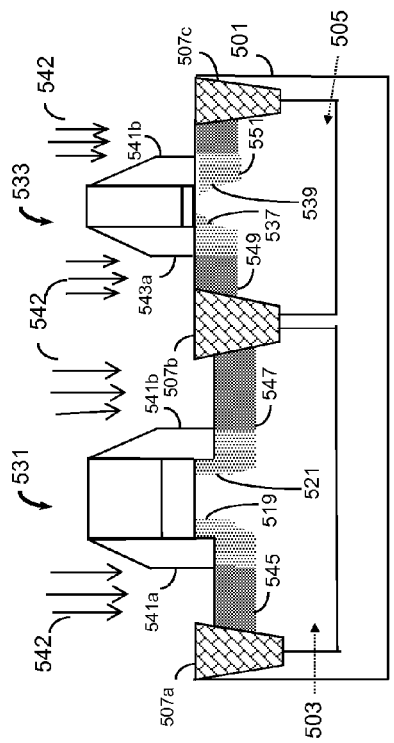

Adverting to FIG. 5I, once resist 536 is removed, spacers 541 and 541b (e.g., of silicon nitride) are formed around gate stack 531, and spacers 543a and 543b are formed around gate 533. The spacers define source/drain regions and protect the poly-silicon gates during the subsequent high-concentration dopant implantation 542 shown in FIG. 4J, for forming highly-doped (e.g., N+) source/drain regions 545 and 547 and 549 and 551. This high-concentration implant has a smaller angular spread than the LDD implant shown in FIG. 5D, but employs higher implant energies to drive dopants further into the substrate 501. In FIG. 5K further processing steps such as formation of metal silicide 553a through 553f and BEOL processes (not shown for illustrative convenience) are performed to complete the integrated circuit device according to an embodiment of the present disclosure, including I/O device 561 and core device 563.

The embodiments of the present disclosure can achieve several technical effects, including lower substrate current ($I_{sub}$), higher breakdown voltage (BVdss), and lower on resistance ($Rds_{on}$). Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming an oxide layer on a substrate surface;
   forming a poly-silicon layer over the oxide layer;
   forming first and second trenches through the oxide and poly-silicon layers and below the substrate surface, defining a gate region therebetween;
   implanting a dopant in a lightly doped drain (LDD) region through the first and second trenches;
   forming spacers on opposite side surfaces of the gate region and extending into the first and second trenches; and
   implanting a dopant in a source/drain region below each of the first and second trenches.

2. The method according to claim 1, further comprising:
   forming a silicide in the first and second trenches, subsequent to implanting the dopant in the source/drain regions.

3. The method according to claim 1, comprising:
   forming the first and second trenches by:
   forming a mask over the oxide and poly-silicon layers, the mask leaving exposed regions defining the first and second trenches, and
   etching the poly-silicon layer, the oxide layer, and the substrate;
   implanting the dopant in the LDD region; and
   removing the mask.

4. The method according to claim 1, comprising:
   forming the first and second trenches to a depth of 10 nm to 200 nm below the substrate surface and to a width of 0.2 µm to 0.6 µm.

5. The method according to claim 1, comprising implanting the dopant in the LDD region at energies of 30 kiloelectron volts (keV) to 300 keV.

6. The method according to claim 1, further comprising:
   forming first and second well regions in the substrate, prior to forming the oxide layer;
   forming the oxide layer to a greater thickness over the first well region than over the second well region; and
   forming the first and second trenches in the first well region.

7. The method according to claim 6, further comprising:
   patterning a second gate region in the poly-silicon and oxide layers over the second well region;
   forming a mask over the substrate, the mask leaving exposed the second gate region and the substrate surface around the second gate region; and
   implanting a dopant in the substrate around the second gate region, forming a second LDD region.

8. A method comprising:
   forming an oxide layer on a substrate surface;
   forming a poly-silicon layer over the oxide layer;
   implanting a dopant in a lightly doped drain (LDD) region in the substrate through the oxide and poly-silicon layers;
   forming first and second trenches in the oxide and poly-silicon layers and in a portion of substrate below the substrate surface, defining a gate region therebetween;
   forming spacers on opposite side surfaces of the gate region and extending into the first and second trenches; and
   implanting a dopant in a source/drain region below each of the first and second trenches.

9. The method according to claim 8, further comprising:
   forming a silicide in the first and second trenches, subsequent to implanting the dopant in the source/drain regions.

10. The method according to claim 8, comprising:
    forming a mask over the oxide and poly-silicon layers, prior to implanting the LDD region, the mask leaving exposed regions defining the first and second trenches.

11. The method according to claim 10, comprising:
    forming the poly-silicon layer to a thickness of 0.05 µm to 0.3 µm.

12. The method according to claim 11, comprising:
    implanting the dopant in the LDD regions at energies of 100 kiloelectron volts (keV) to 400 keV.

13. The method according to claim 8, comprising:
    forming the first and second trenches to a depth of 10 nm to 200 nm below the substrate surface and a width of 0.2 µm to 0.6 µm.

14. The method according to claim 8, further comprising:
    forming first and second well regions in the substrate, prior to forming the oxide layer;
    forming the oxide layer to a greater thickness over the first well region than over the second well region; and forming the first and second trenches in the first well region.

15. The method according to claim 14, comprising:

patterning a second gate region in the poly-silicon and oxide layers over the second well region;

forming a mask over the substrate, the mask leaving exposed the second gate region and the substrate surface around the second gate region; and implanting a dopant in the substrate around the second gate region, forming a second LDD region.

* * * * *